(12) United States Patent
Kim et al.

(10) Patent No.: US 9,136,270 B2
(45) Date of Patent: Sep. 15, 2015

(54) MEMORY DEVICE

(71) Applicant: Samsung Electronics Co., Ltd., Suwon-Si, Gyeonggi-Do (KR)

(72) Inventors: Hyun-Chul Kim, Seoul (KR); Jae-Seok Kim, Hwaseong-si (KR); Chan-Hong Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/027,372

(22) Filed: Sep. 16, 2013

(65) Prior Publication Data

US 2014/0117459 A1   May 1, 2014

(30) Foreign Application Priority Data

Oct. 26, 2012   (KR) .................. 10-2012-0120036

(51) Int. Cl.
*H01L 29/78* (2006.01)
*H01L 27/108* (2006.01)
*H01L 29/423* (2006.01)
*H01L 21/762* (2006.01)

(52) U.S. Cl.
CPC .... *H01L 27/10891* (2013.01); *H01L 21/76232* (2013.01); *H01L 27/10876* (2013.01); *H01L 29/4236* (2013.01); *H01L 29/78* (2013.01)

(58) Field of Classification Search
CPC .................. H01L 2924/0002; H01L 2924/00; H01L 21/76877
See application file for complete search history.

(56) References Cited

U.S. PATENT DOCUMENTS

| | | | |
|---|---|---|---|
| 6,858,516 B2 | 2/2005 | Ho et al. | |
| 7,691,722 B2 | 4/2010 | Zhou | |
| 2003/0013272 A1* | 1/2003 | Hong et al. | 438/437 |
| 2004/0266133 A1* | 12/2004 | Kim | 438/424 |
| 2005/0079682 A1* | 4/2005 | Lee et al. | 438/400 |
| 2006/0270183 A1* | 11/2006 | Kim et al. | 438/424 |
| 2007/0072387 A1* | 3/2007 | Lai et al. | 438/424 |
| 2009/0029556 A1 | 1/2009 | Liao et al. | |
| 2009/0068816 A1* | 3/2009 | Eun | 438/425 |
| 2009/0068817 A1* | 3/2009 | Eun | 438/425 |
| 2012/0025329 A1 | 2/2012 | Wu et al. | |

FOREIGN PATENT DOCUMENTS

| | | |
|---|---|---|
| KR | 100567872 B1 | 4/2006 |
| KR | 20060070364 A | 6/2006 |
| KR | 20070054894 A | 5/2007 |
| KR | 20080019429 A | 3/2008 |
| KR | 20100026222 A | 3/2010 |

* cited by examiner

*Primary Examiner* — Jaehwan Oh
(74) *Attorney, Agent, or Firm* — Harness, Dickey & Pierce, P.L.C.

(57) ABSTRACT

A device isolation layer of the memory device includes a first insulation layer in a lower portion of a device isolation trench, a second insulation layer in an upper portion of the device isolation trench and a separation layer between the first insulation layer and the second insulation layer. First and second conductive fillers are in the first and second insulation layers and are separated by the separation layer.

14 Claims, 13 Drawing Sheets

MEMORY DEVICE

CROSS-REFERENCE TO RELATED APPLICATIONS

This application claims the benefit of Korean Patent Application No. 10-2012-0120036 filed on Oct. 26, 2012 in the Korean Intellectual Property Office, the disclosure of which is incorporated herein in its entirety by reference.

BACKGROUND

1. Field

Some example embodiments relate to a memory device and a method of manufacturing the same, and more particularly, to a memory device including a buried channel array transistor (BCAT) and a method of manufacturing the same.

2. Description of the Related Art

As recent memory devices have been highly integrated, the width and gap distance of line patterns in a cell transistor have been reduced and thus the channel length of the transistor has been shortened. When the channel length is decreased to be shorter than an effective channel length for the operation of the transistor, the electronic characteristics of the transistor are deteriorated due to the short channel effect.

For those reasons, a recess-channel transistor or a buried-channel array transistor (BCAT) have been provided for sufficiently increasing the channel length. Particularly, the BCAT can be manufactured to have 6F2-structured word lines in such a configuration that the pitch of the word lines is reduced to about 0.5F, which can minimize or reduce the occupation of the BCAT in each cell of the memory device. Thus, the BACT has been used in recent memory devices from the viewpoints of channel increase and size reduction of the memory device.

According to the conventional 6F2-structured BCAT, voids frequently occur in the device isolation layer along a minor axis of the active region and the voids are usually filled with conductive materials of the buried gate structure, thereby forming conductive residual fillers in the device isolation layer. The conductive residual fillers usually function as a leakage path for leakage currents in the device isolation layer.

SUMMARY

Some example embodiments of the present inventive concepts provide a memory device for preventing or inhibiting the leakage currents via the conductive residual fillers in the voids of the device isolation layer. Other example embodiments of the present inventive concepts provide a method of manufacturing the memory devices.

According to an example embodiment, a memory device includes a substrate having an active region and a field region defining the active region, the field region having a device isolation trench, a device isolation layer in the device isolation trench of the substrate, a gate structure on the active region of the substrate, an impurity layer on the active region and adjacent to the gate structure, and a conductive interconnector contacting the impurity layer. The device isolation layer may have a first insulation layer in a lower portion of the device isolation trench and having a first void, a second insulation layer in an upper portion of the device isolation trench and having a second void, and a separation layer between the first insulation layer and the second insulation layer.

In an example embodiment, the gate structure may include a buried structure including a buried gate insulation layer on an inner sidewall and a bottom surface of a gate trench of the active region of the substrate, a buried gate conductive layer on the buried gate insulation layer and filling a lower portion of the gate trench, and a capping layer on the buried gate conductive layer and filling an upper portion of the gate trench.

In an example embodiment, the impurity layer may be arranged on surface portions of the active region at side portions of the buried structure in order to form a buried channel array transistor (BCAT) on the active region of the substrate.

In an example embodiment, the device isolation layer may further include a sidewall oxide layer on an inner sidewall and a bottom surface of the device isolation trench. The separation layer may be on a portion of the sidewall oxide layer and on an upper surface of the first insulation layer, the first insulation layer may be defined by the sidewall oxide layer and the separation layer, and the second insulation layer may be enclosed by the separation layer.

In an example embodiment, the sidewall oxide layer may include a lower oxide layer having a first thickness from the bottom surface and the inner sidewall of the device isolation trench, an upper oxide layer having a second thickness less than the first thickness from the inner sidewall of the device isolation trench, and a stepped portion between the lower oxide layer and the upper oxide layer.

In an example embodiment, the sidewall oxide layer and the separation layer may include silicon oxide and the first insulation layer and the second insulation layer may include silicon nitride.

In an example embodiment, the memory device may include a first conductive filler in the first void of the first insulation layer, and a second conductive filler in the second void of the second insulation layer.

In an example embodiment, the first and the second conductive fillers may include a same material as the buried conductive layer.

In an example embodiment, the conductive interconnector may contact the second conductive filler of the device isolation layer.

According to another example embodiment, a method of manufacturing a memory device includes forming a device isolation trench in a field region of a substrate, the field region defining an active region of the substrate, forming a device isolation layer in the device isolation trench of the substrate, forming a gate structure on the active region of the substrate, forming an impurity layer on the active region and adjacent to the gate structure, and forming a conductive interconnector contacting the impurity layer. The device isolation layer may include a first insulation layer in a lower portion of the device isolation trench and having a first void, a second insulation layer in an upper portion of the device isolation trench and having a second void, and a separation layer between the first insulation layer and the second insulation layer.

In an example embodiment, the device isolation layer may be formed by forming a preliminary sidewall oxide layer on the substrate conformal with a surface profile of the device isolation trench, forming a first preliminary insulation layer on the preliminary sidewall oxide layer and filling the lower portion of the device isolation trench together with the first void, partially removing the first preliminary insulation layer and the preliminary sidewall oxide layer from the substrate to form a sidewall oxide layer covering an inner sidewall and a bottom surface of the device isolation trench, the sidewall oxide layer including a stepped portion on the inner sidewall of the device isolation trench and filling the lower portion of the device isolation trench, forming a preliminary separation layer on an upper portion and the stepped portion of the sidewall oxide layer and the first insulation layer, forming a second preliminary insulation layer on the preliminary separation layer and filling the upper portion of the device isolation trench together with the second void, and partially removing the second preliminary insulation layer and the preliminary separation layer until an upper surface of the active region of the substrate is exposed to simultaneously form the separation layer and the second insulation layer, the separation layer covering the first insulation layer and an upper portion of the sidewall oxide layer and the second insulation layer filling the upper portion of the device isolation trench together with the second void.

In an example embodiment, the preliminary sidewall oxide layer and the preliminary separation layer may be formed by one of a high temperature chemical vapor deposition (CMP) process, a middle temperature CMP process and a high density plasma CMP (HDPCMP) process, and the first preliminary insulation layer and the second preliminary insulation layer may be formed by a low pressure CMP (LPCMP) process.

In an example embodiment, the first preliminary insulation layer and the preliminary sidewall oxide layer may be partially removed by a wet etching process using phosphoric ($H_3PO_4$) aqueous solution as an etchant.

In an example embodiment, the gate structure may be formed by forming a gate trench on the active region of the substrate, forming a gate conductive layer on an inner sidewall and a bottom surface of the gate trench, and forming a gate conductive layer in a lower portion of the gate trench.

In an example embodiment, forming the gate trench may include partially removing the device isolation layer adjacent to the active region to expose the first void and the second void, and forming the gate conductive layer may include filling the first and the second voids with conductive materials to form first and second conductive residual fillers in the first and the second voids, respectively.

In an example embodiment, the conductive interconnector may be formed by partially removing the impurity layer and the device isolation layer to expose the second conductive residual filler, and forming a buried contact contacting the impurity layer and the second conductive residual filler.

According to yet another example embodiment, a structure includes a device isolation layer in a device isolation trench of a substrate. The device isolation layer includes a first insulation layer in a lower portion of the device isolation trench, the first insulation layer having a first conductive filler filling a first void formed therein, a second insulation layer in an upper portion of the device isolation trench, the second insulation layer having a second conductive filler filling a second void formed therein, and a separation layer between the first insulation layer and the second insulation layer.

In yet another example embodiment, the structure may further include a sidewall oxide layer on an inner sidewall and a bottom surface of the device isolation trench. The separation layer may be on a portion of the sidewall oxide layer and on an upper surface of the first insulation layer, the first insulation layer may be defined by the sidewall oxide layer and the separation layer, and the second insulation layer may be enclosed by the separation layer.

In yet another example embodiment, the sidewall oxide layer may include a lower oxide layer having a first thickness from the bottom surface and the inner sidewall of the device isolation trench, and an upper oxide layer having a second thickness from the inner sidewall of the device isolation trench, the second thickness less than the first thickness, and a stepped portion between the lower oxide layer and the upper oxide layer.

In yet another example embodiment, the structure may further include a substrate having an active region and a field region defining the active region, a gate structure on the active region of the substrate, an impurity layer on the active region and adjacent to the gate structure, and a conductive interconnector configured to contact the impurity layer, wherein the device isolation trench may be formed in the field region.

In yet another example embodiment, the conductive interconnector may be configured to contact the second conductive filler of the device isolation layer.

In yet another example embodiment, the gate structure may include a buried structure on an inner sidewall and a bottom surface of a gate trench of the active region of the substrate, the buried structure including a buried gate insulation layer, a buried gate conductive layer on the buried gate insulation layer, the buried gate conductive layer filling a lower portion of the gate trench, and a capping layer on the buried gate conductive layer, the capping layer filling an upper portion of the gate trench.

In yet another example embodiment, the sidewall oxide layer and the separation layer may include silicon oxide, the first insulation layer and the second insulation layer may include silicon nitride, and the first and the second conductive fillers include a same material as the buried gate conductive layer.

According to some example embodiments of the present inventive concepts, when lower and upper voids may be generated in the device isolation layer due to the decrease of the space margin of the device isolation layer, the upper void and the lower void may be separated from each other by the separation layer. Thus, although upper and lower conductive fillers may be provided in the upper and lower voids, respectively, and the upper conductive filler may be connected to the interconnector of the memory device, the leakage current may be prevented or inhibited from passing to the lower conductive filler, thereby preventing or inhibiting the leakage path in the device isolation layer.

BRIEF DESCRIPTION OF THE DRAWINGS

Example embodiments will be more clearly understood from the following detailed description taken in conjunction with the accompanying drawings.

DETAILED DESCRIPTION

Figure 1:
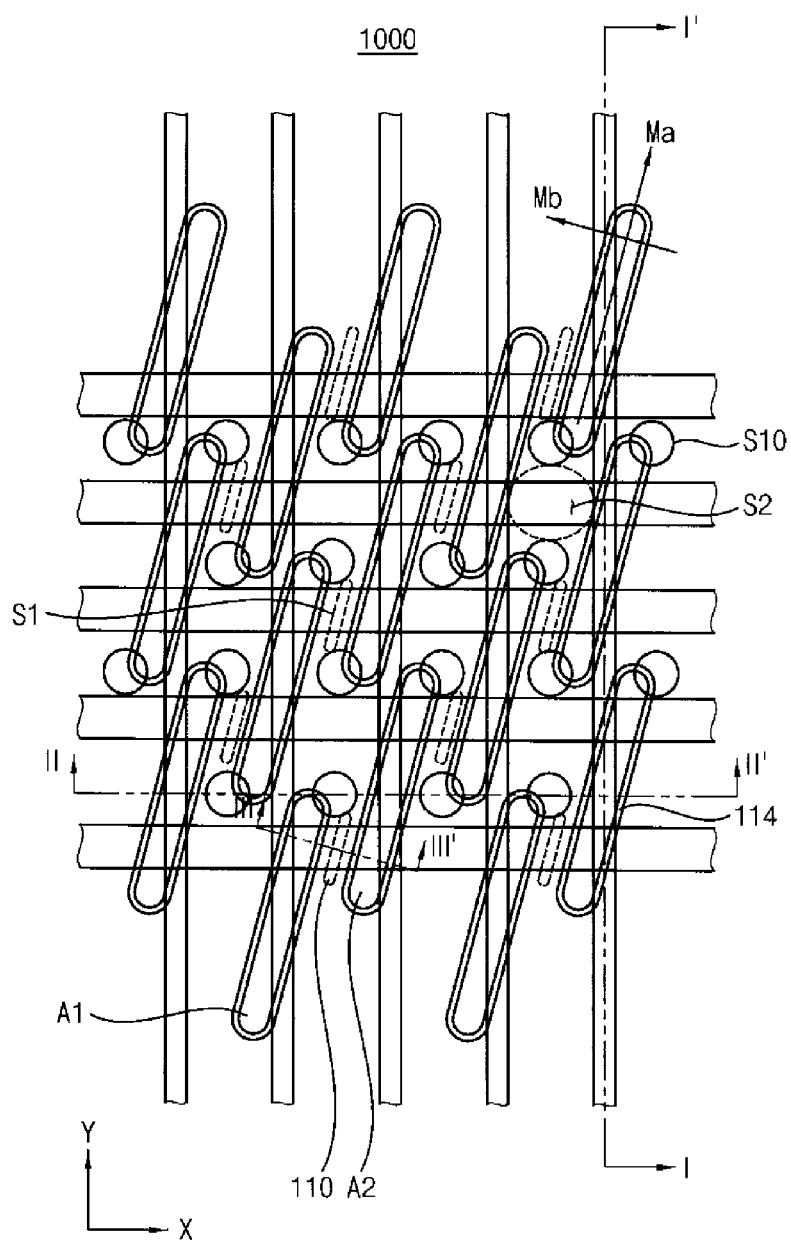
FIG. 1 is a plan view illustrating a memory device in accordance with an example embodiment of the present inventive concepts.

Various example embodiments will be described more fully hereinafter with reference to the accompanying drawings, in which some example embodiments are shown. The inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some example embodiments will be explained in detail with reference to the accompanying drawings.

Memory Device

Figure 2A:
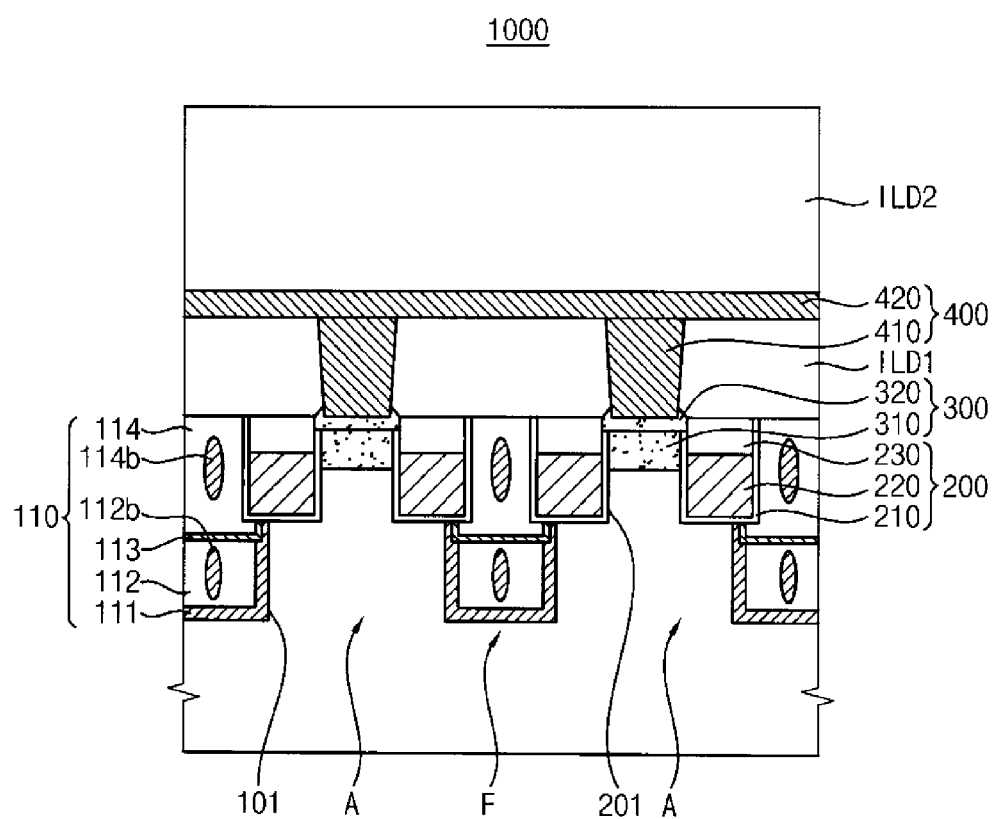
FIG. 2A is a cross-sectional view cut along a line I-I' of the memory device shown in FIG. 1.
Figure 2B:
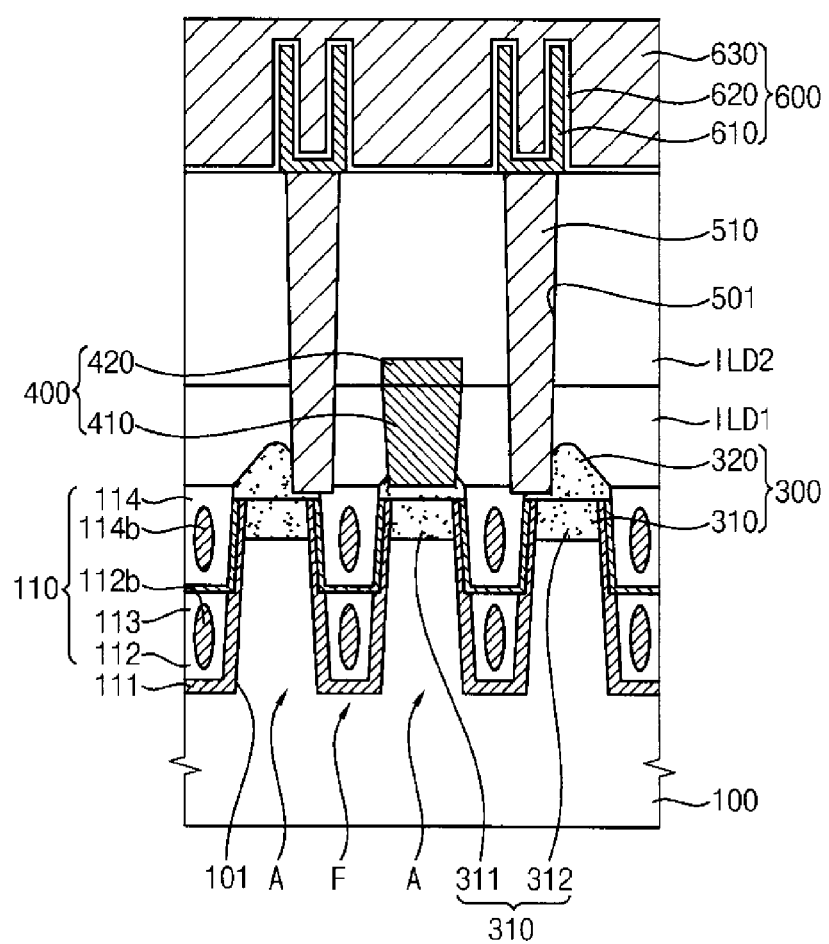
FIG. 2B is a cross-sectional view cut along a line II-II' of the memory device shown in FIG. 1.
Figure 3:
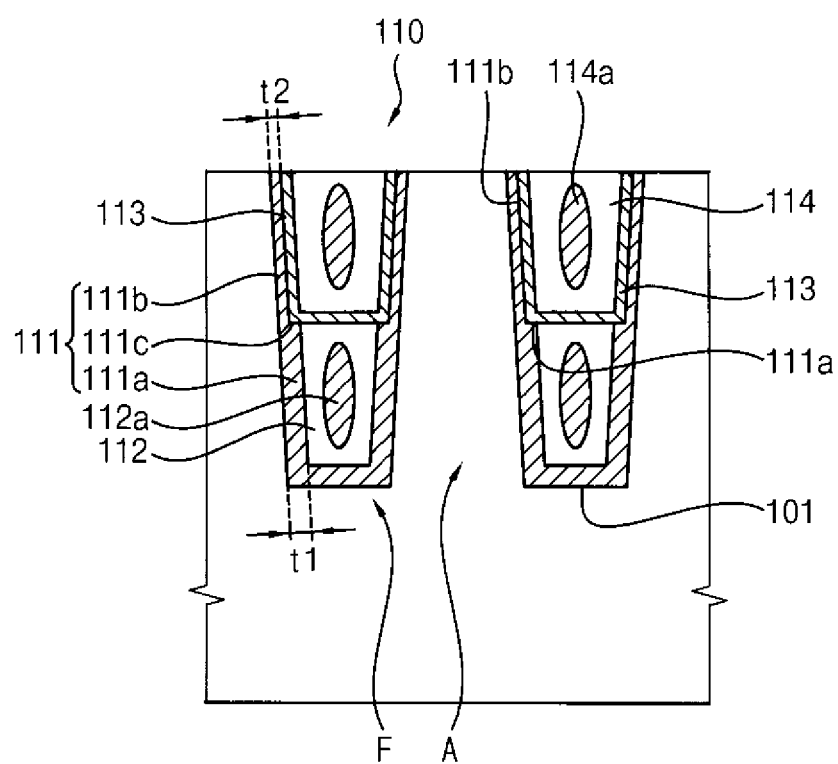
FIG. 3 is an enlarged view illustrating a device isolation layer of the memory device shown in FIG. 1.

FIG. 1 is a plan view illustrating a memory device in accordance with an example embodiment of the present inventive concepts. FIG. 2A is a cross-sectional view cut along a line I-I' of the memory device shown in FIG. 1, and FIG. 2B is a cross-sectional view cut along a line II-II' of the memory device shown in FIG. 1. FIG. 3 is an enlarged view illustrating a device isolation layer of the memory device shown in FIG. 1.

In the present example embodiment of the memory devices, the word line includes a series of buried channel array transistors (BCAT) that may be buried into a substrate. However, the inventive concepts may be applied to other memory devices including various transistors in place of the BCATs as long as neighboring active regions are sufficiently close and isolated voids are provided at lower and upper portions of the device isolation layer between the neighboring active regions.

Referring to FIGS. 1, 2A, 2B and 3, the memory device 1000 in accordance with an example embodiment of the present inventive concepts may include a substrate 100 that may have an active region A and a field region F defining the active region A, a gate structure 200 on the active region A of the substrate 100, a contact member 300 at a side portion of the gate structure 200 and an interconnector 400 connected to the contact member 300. A device isolation trench 101 may be provided in the field region F of the substrate 100 and a device isolation layer 110 may be provided in the device isolation trench 101. The device isolation layer 110 may include a first insulation layer 112 having a first void 112a at a lower portion of the device isolation trench 101, a second insulation layer 114 having a second void 114a at an upper portion of the device isolation trench 101 and a separation layer 113 interposed between the first and the second insulation layers 112 and 114.

For example, the substrate 100 may include a semiconductor substrate comprising silicon (Si) or germanium (Ge). Otherwise, the substrate 100 may also include a silicon-on-insulator (SOI) substrate. The substrate 100 may be divided into the active region A on which conductive structures of a transistor may be arranged and a field region F defining the active region A. The substrate 100 may be recessed downwards from a surface thereof at the field region F, and thus the device isolation trench 101 may be provided in the field region F of the substrate 100. The device isolation layer 110 may be provided in the device isolation trench 101 and thus the conductive structures on the neighboring active regions A may be electrically separated from each other by the device isolation layer 110.

In the present example embodiment, the active regions A may be arranged in a 6F2 layout and may be slanted at a given (or alternatively, predetermined) slant angle with respect to a word line WL and a bit line BL of the memory device 1000, thereby minimizing the occupation of a cell transistor of the memory device.

Therefore, the active region A may be shaped into an eclipse having a major axis Ma slanted with respect to both of the word line WL and the bit line BL and a minor axis Mb perpendicular to the major axis Ma. A plurality of the active regions A arranged in the major axis Ma may be alternately shifted along the minor axis Mb.

Thus, a couple of the active regions A arranged in the major axis Ma may be spaced apart by a larger space margin S2 and a couple of the active regions A arranged in the minor axis Mb may be spaced apart by a smaller space margin 51.

When a line space of patterns of the memory device 1000 may be reduced as the reduction of the cell size, the device isolation trench that may be positioned in the smaller space margin Si between the active regions A arranged in the minor axis Mb (referred to as minor axis-directed trench) may be more greatly reduced than the device isolation trench that may be positioned in the larger space margin S2 between the active regions A arranged in the major axis Ma (referred to as major axis-directed trench). Thus, the minor axis-directed trench may have an aspect ratio greater than the major axis-directed trench.

The device isolation layer 110 may include a sidewall oxide layer 111 that may be positioned on a bottom and inner sidewall of the device isolation trench 101 and may define the first insulation layer 112. The separation layer 113 may be positioned on the first insulation layer 112 and on an upper portion of the sidewall oxide layer 111 in such a configuration that the second insulation layer 114 may be enclosed by the separation layer 113. Thus, the first insulation layer 112 and the second insulation layer 114 may be separated by the separation layer 113.

For example, the sidewall oxide layer 111 may include a deposited oxide layer having a relatively improved step coverage characteristic. The sidewall oxide layer 111 may prevent or inhibit additional oxidation to the inner sidewall of the device isolation trench 101. The deposited oxide layer may include a silicon oxide layer deposited by a middle temperature or a high temperature deposition process or by a high density plasma chemical vapor deposition (HDPCVD) process. Therefore, the sidewall oxide layer 111 may be deposited onto the bottom and inner sidewalls of the trench 101 conformal with the surface profile of the trench 101, so that the inner sidewall of the trench 101 may be covered with the sidewall oxide layer 111.

In the present example embodiment, the sidewall oxide layer 111 may include a lower oxide layer 111a having a first thickness t1 from both of the bottom and the inner sidewall of the trench 101 and an upper oxide layer 111b having a second thickness t2 lower than the first thickness t1 from the inner sidewall of the trench 101. Thus, a stepped portion 111c may be provided between the lower oxide layer 111a and the upper oxide layer 111b.

The first insulation layer 112 may be enclosed by the lower oxide layer 111a and may fill a lower portion of the trench 101. A first void 112a may be provided in the first insulation layer 112. Particularly, a top surface of the first insulation layer 112 may be coplanar with a surface of the stepped portion 111c of the sidewall oxide layer 111.

For example, the sidewall oxide layer 111 may include a liner layer that may prevent or inhibit the penetration of oxide materials into the substrate 100 and the generation of the internal stress at the inner sidewall of the trench 101. The first insulation layer 112 may comprise a silicon nitride having an improved step coverage characteristic.

The lower portion of the trench 101 may be filled with the first insulation layer 112 despite the improved step coverage of the first insulation layer 112 due to the high aspect ratio of the trench 101. Particularly, since the aspect ratio of the minor axis-directed trench may be greater than that of the major axis-directed trench, the lower portion of the minor axis-directed trench may be sufficiently filled with the first insulation layer 112. In addition, the relatively high aspect ratio of the trench 101 may generate a first void 112a in the first insulation layer 112 that may be caused by an overhang and undesirable step coverage. As a result, the first insulation layer 112 may make contact with the lower oxide layer 111a and may fill the lower portion of the trench 101.

That is, the first insulation layer 112 having the first void 112a therein may fill the lower portion of the trench 101 and the top surface of the first insulation layer 112 may be coplanar with the surface of the stepped portion of the sidewall oxide layer 111.

The separation layer 113 may be positioned on the upper oxide layer 111b, the surface of the stepped portion 111c and the top surface of the first insulation layer 112 conformal with the surface profile of the upper portion of the trench 101. The separation layer 113 may compensate for a smaller thickness of the upper oxide layer 111b at an upper portion of the trench 101 and may isolate the first insulation layer 112 having the first void 112a from surrounding layers. Thus, the upper portion of the sidewall oxide layer 111 may include a stack layer of the upper oxide layer 111b and the separation layer 113 and the first insulation layer 112 having the first void 112a may be covered with the separation layer 113. The separation layer 113 may include an oxide layer formed by a deposition process. In the present example embodiment, the separation layer 113 may include the same silicon oxide layer as the sidewall oxide layer 111.

The second insulation layer 114 may fill the upper portion of the trench 101 that may be defined by the separation layer 113. That is, the upper portion of the trench 101 may be filled with the upper oxide layer 111b and the separation layer 113. The second void 114a may be provided in the second insulation layer 114.

In the present example embodiment, a side surface of the second insulation layer 114 may make contact with a contact pad 320 and the sidewall oxide layer 111 and the separation layer 113 may be positioned under the contact pad 320. Otherwise, when no contact pad may be provided around the trench 101, upper surfaces of the second insulation layer 114, the sidewall oxide layer 111 and the separation layer 113 may be coplanar with the upper surface of the impurity layer 310, as would be known to one of the ordinary skill in the art.

For example, the second insulation layer 114 may include a liner layer for preventing or inhibiting internal stresses at the upper portion of the trench 101. In the present example embodiment, the second insulation layer 114 may comprise the same silicon nitride as the first insulation layer 112.

The upper portion of the trench 101 may be filled with the second insulation layer 114 despite the improved step coverage of the second insulation layer 114 due to the higher aspect ratio of the trench 101. In addition, the higher aspect ratio of the trench 101 may generate the second void 114a in the second insulation layer 114 that may be caused by the overhang and the undesirable step coverage. As a result, the second insulation layer 114 may make contact with the separation layer 113 and may fill the upper portion of the trench 101

Accordingly, the device isolation trench 101 may be sufficiently filled with liner layers such as the first and the second insulation layers 112 and 114 without any gap-fill layers, thereby providing the device isolation layer 110 in the trench 101. Particularly, although being located in the device isolation layer 110, the first and the second voids 112a and 114a may be sufficiently separated from each other by the separation layer 113.

Therefore, even though the first and the second voids 112a and 114a may be opened and filled with conductive materials in a subsequent process such as a process for forming a gate conductive layer and thus conductive residual fillers may be provided in each of the first and the second voids 112a and 114a, each of the conductive residual fillers may be electrically separated by the separation layer 113, thereby preventing or inhibiting a leakage path through the device isolation layer 110.

Since the minor axis-directed trenches 101 may have a space margin smaller than the major axis-directed trenches, the minor axis-directed trench 101 may be sufficiently filled just merely with the first and the second insulation layers 112 and 114 without any gap-fill layers, to thereby provide the device isolation layer in the minor axis-directed trench 101 (hereinafter referred to as minor device isolation layer). However, if necessary, an additional gap-fill layer may be needed for filling the major axis-directed trench 101 after filling the trench 101 with the liner layers such as the first and the second insulation layers 112 and 114, to thereby provide the device isolation layer in the major axis-directed trench 101 (hereinafter referred to as major device isolation layer). That is, if necessary, the major device isolation layer may further include a gap-fill layer enclosed by the second insulation layer 114 at the upper portion of the major axis-directed trench 101.

The gate structure 200 may include a buried gate insulation layer 210, a buried gate conductive layer 220 and a capping layer 230. The active region A of the substrate 100 may be partially recessed from a surface thereof and thus a gate trench 201 may be provided on the active region A. The buried gate insulation layer 210 may be positioned along a bottom and an inner sidewall of the gate trench 201 and the buried gate conductive layer 220 may be provided on the buried gate insulation layer 210 at a lower portion of the gate trench 201. The capping layer 230 may be positioned on the buried gate conductive layer 220 in such a configuration that an upper portion of the gate trench 201 may be filled with the capping layer 230 and thus the buried gate conductive layer 220 may be covered with the capping layer 230. Therefore, the buried gate conductive layer 220 may be protected by the capping layer 230.

In the present example embodiment, a pair of the gate trenches 201 may be provided on the active region A in the direction of the major axis Ma and the buried gate insulation layer 210, the buried gate conductive layer 220 and the capping layer 230 may be provided in each of the gate trenches 201. Accordingly, a pair of the buried gate structures 200 may be spaced apart from each other along the major axis Ma of the active region A.

Impurities may be implanted onto a portion of the surface of the active region A between the pair of the buried gate structures 200, and thus an impurity layer 310 may be provided at side portions of the buried gate structures 200 on the active region A. In the present example embodiment, a contact pad 320 may be positioned on the impurity layer 310 as a supplementary conductive pad, to thereby provide the contact member 300 including the impurity region 310 and the contact pad 320 at the side of the buried gate structures 200. The contact pad 320 may enlarge a contact area that may make contact with an interconnection, to thereby decrease contact resistance between the interconnection and the contact member 300. The gate structure 200 may be electrically connected with exterior signal sources via the electrical contact between the interconnection and the contact member 300.

For example, a first impurity layer 311 may be positioned at a central portion of the active region A between the pair of the buried gate structures 200 and may be connected to a bit line contact 410. Thus, the first impurity layer 311 may function as a drain region in the memory device 1000. A second impurity layer 312 may be positioned at peripheral portions of the active region A around both of the buried gate structures 200 and may be connected to a storage node contact 510 filling an opening 501. Thus, the second impurity layer 312 may function as a source region in the memory device 1000.

Therefore, the buried gate structures 200 and the impurity layer 310 adjacent to the gate structures 200 and functioning as the source and drain regions may be provided on the active region A of the substrate 100, to thereby provide a buried channel array transistor (BCAT) on the substrate 100.

A pair of the buried gate structures 200 that may be linearly arranged in a first direction X and may be spaced apart by the smaller space margin Si in which the minor device isolation layer 110 are positioned may be commonly connected to the word line WL of the memory device 1000.

The first and the second voids 112a and 114a may be filled with conductive materials of the gate conductive layer 220 and first and second conductive fillers 112b and 114b may be provided in the minor device isolation layers 110. The first and the second voids 112a and 114a may be exposed in forming the gate trench 201 and the conductive materials of the gate conductive layer 220 may remain in the exposed first and the second voids 112a and 114a. Thus, the conductive materials of the gate conductive layer 220 may be isolated in the voids 112a and 114a as the conductive residual fillers 112b and 114b.

A first insulation interlayer ILD1 may be provided on the substrate 100 including the buried gate structure 200 and the contact member 300 and the bit line contact 410 may penetrate through the first insulation interlayer ILD1. The bit line contact 410 may make contact with the contact pad 320 on the first impurity layer 311. A conductive line 420 may extend on the first insulation interlayer ILD1 along a second direction Y as the bit line BL of the memory device 1000. The conductive line 410 may make contact with the bit line contact 410 and thus may be electrically connected to the drain region of the BCAT.

A second insulation interlayer ILD2 may be positioned on the first insulation interlayer ILD2 to a sufficient thickness to cover the conductive line 420. The storage node contact 510 may penetrate through the first and the second insulation interlayers ILD1 and ILD2 and may be electrically connected to the source region of the BCAT.

Particularly, the storage node contact 510 may be partially positioned on the minor device isolation layer 110 as well as the source region of the second impurity region 312. That is, the storage node contact 510 of the BCAT may be across both of the source regions that may be provided at both peripheral portions of the slant active region A and the field region F adjacent to the source region, and thus the second conductive residual fillers 114b in the device isolation layer 110 may make contact with the storage node contact 510. For example, a portion of the contact pad 320 and a portion of the minor device isolation layer 110 may be removed from the substrate 100 so as to enlarge the contact area between the source region and the interconnector. In such a case, the second insulation interlayer ILD2 may also be partially removed from the substrate 100 and the storage node contact 510 may make contact with the second conductive residual fillers 114b.

However, even though the storage node contact 510 may make contact with the second conductive residual fillers 114b, the second conductive residual fillers 114b may be separated from the first conductive residual fillers 112b by the separation layer 113, to thereby prevent or inhibit the leakage current from leaking through the first and the second fillers 112b and 114b in the device isolation layer 110. That is, although the storage node contact 510 may be electrically connected to the second conductive residual fillers 114b, the second conductive residual fillers 114b may not be connected to the first conductive residual fillers 112b by the separation layer 113 and thus the leakage current may not pass toward the first fillers 112b from the second fillers 114b. That is, the leakage path may be sufficiently prevented or inhibited in the device isolation layer 110 in spite of the first and the second conductive residual fillers 112b and 114b in the memory device 1000. Accordingly, the leakage path may be sufficiently prevented or inhibited in the device isolation layer 110 of the memory device 1000, to thereby reduce the leakage current and prevent or inhibit operation failures caused by the leakage current in the memory device 1000.

A capacitor structure 600 may be positioned on the second insulation interlayer ILD2 and may be connected to the storage node contact 510. For example, the capacitor structure 600 may include a storage electrode 610 that may be connected to the storage node contact 510, a dielectric layer 620 that may cover the storage electrode 610 and a plate electrode 630 that may cover the dielectric layer 620.

According to example embodiments of the memory device, when voids may be generated at lower and upper portions of the device isolation layer of the memory device due to the higher aspect ratio caused by the space margin reduction of the field region, the upper void and the lower void may be separated from each other by the separation layer. Therefore, when the voids are filled with conductive materials and further the upper conductive fillers may be connected to the interconnector of the memory device, the leakage current may be sufficiently prevented or inhibited from passing to the lower conductive fillers from the upper conductive fillers. Accordingly, no leakage path is provided in the device isolation layer of the memory device.

Particularly, in case of the memory device including the BCATs, the voids of the minor device isolation layer may be opened in an etching process against the active region for forming the gate trench and the opened voids may be filled with the conductive materials when forming the gate conductive layer. For those reasons, the memory device including the BCATs may more frequently include the conductive residual fillers in the device isolation layers as the memory devices may be downsized. In such a memory device including the conductive residual fillers, even though the storage node contact may be connected to the upper conductive residual fillers at an upper portion of the device isolation layer and thus the leakage current may pass to the upper void conductive residual fillers from the storage node contact, the leakage current may be prevented or inhibited from passing to the lower conductive residual fillers by the separation layer in the device isolation layer since the upper and the lower conductive residual fillers may be separated from each other by the separation layer, thereby preventing or inhibiting the leakage path in the device isolation layer of the memory device.

Method of Manufacturing the Memory Device

FIGS. 4A to 4G, 5A to 5C and 6A to 7B are cross-sectional views illustrating processing steps for manufacturing the memory device shown in FIGS. 1 to 3. FIGS. 4A to 4G are cross-sectional views cut along a line II-II' of the memory device shown in FIG. 1 and illustrates the processing steps for forming the minor device isolation layer in which the voids are most likely to be generated as the memory device is downsized. FIGS. 5A to 5C are cross-sectional views cut along a line III-III' of the memory device shown in FIG. 1 and illustrates the processing steps for forming the buried gate structures on the substrate. FIGS. 6A to 7B illustrates the processing steps for forming the impurity region and the interconnector making contact with the impurity region.

Figure 4A:
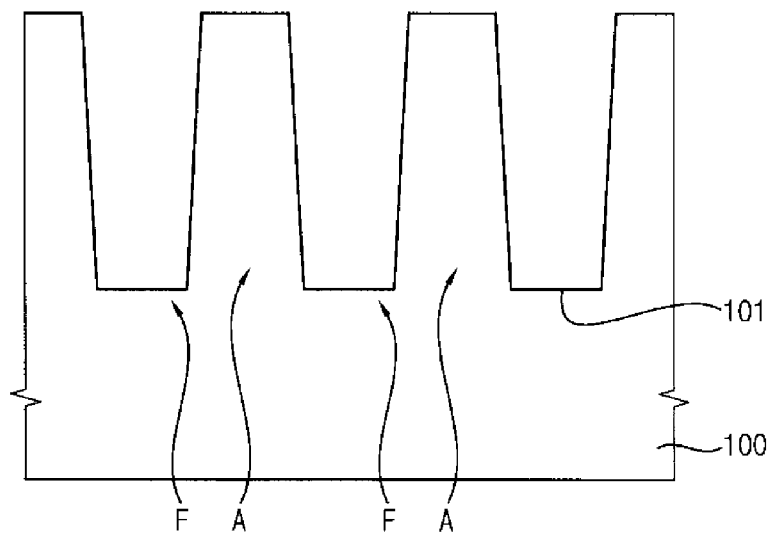
FIGS. 4A to 4G are cross-sectional views illustrating processing steps for forming a device isolation layer of the memory device shown in FIG. 1.
Figure 5A:
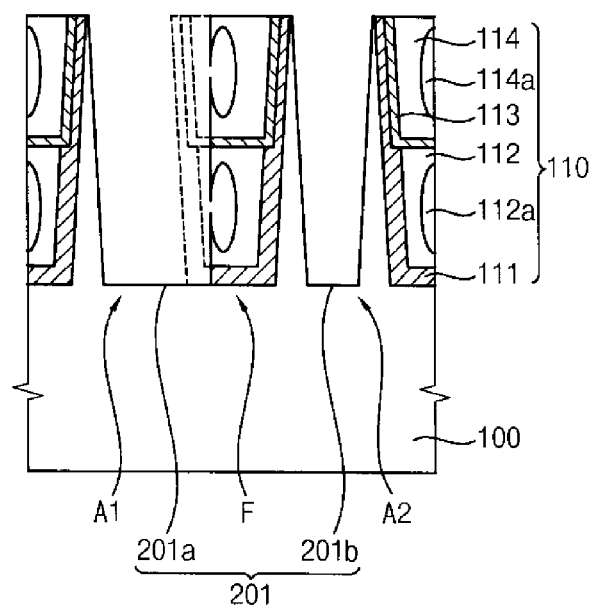
FIGS. 5A to 5C are cross-sectional views illustrating processing steps for forming a buried gate structures of the memory device shown in FIG. 1.
Figure 5B:
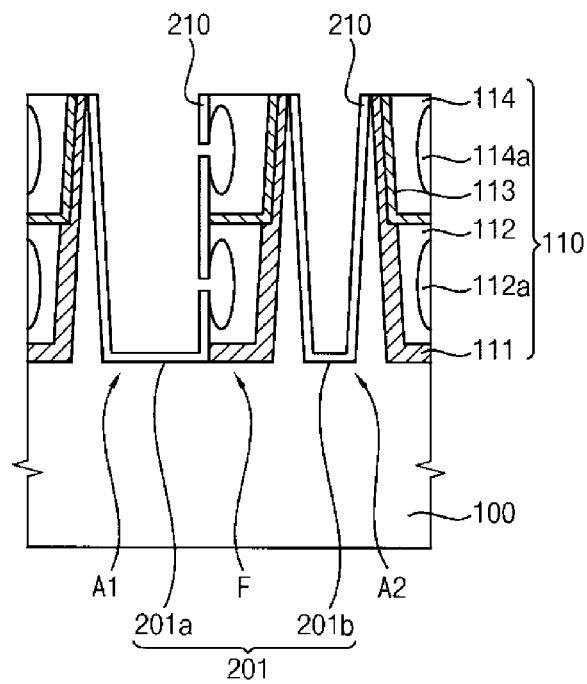
Figure 5C:
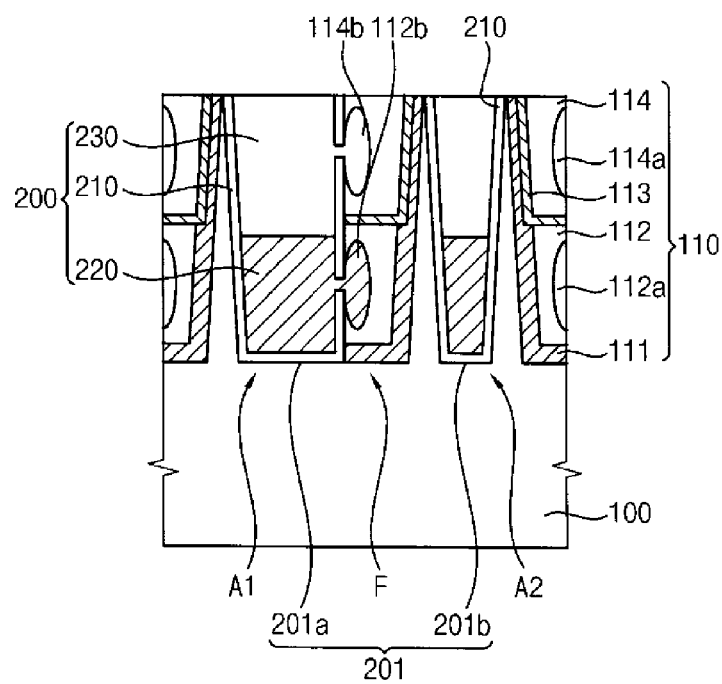

Referring to FIG. 4A, the substrate 100 including the active region A and the field region F defining the active region A may be partially recessed at the field region F and the trench 101 may be formed on the substrate 100. Particularly, the minor axis-directed trench 101 interposed between the elliptical active regions A along the minor axis Mb thereof may be illustrated in FIG. 4A. However, the major axis-directed trench interposed between the elliptical active regions A along the major axis Ma thereof may also be illustrated substantially in the same drawing, except for the size of the trench, as would be known to one of the ordinary skill in the art.

For example, the substrate 100 may include a semiconductor substrate comprising silicon (Si) or germanium (Ge). Otherwise, the substrate 100 may also include a silicon-on-insulator (SOI) substrate. Various conductive structures such as the buried gate structures 200 and the word lines WL may be formed on the active regions A of the substrate 100 in a subsequent process and the conductive structures on the neighboring active regions A may be electrically separated from each other by the device isolation layer 110 in the trench 101 of the field region F.

For example, a mask pattern (not illustrated) may be formed on the substrate 100 in such a configuration that the active region A may be covered and the field region F may be exposed and the exposed field region F of the substrate 100 may be etched off by an etching process using the mask pattern as an etching mask, thereby forming the trench 101 to a given (or alternatively, predetermined) depth at the field region F of the substrate 100. The mask pattern may include a pad oxide pattern that may be formed on a surface of the substrate 100 by a thermal oxidation process and a nitride pattern that may be formed on the pad oxide pattern to a sufficient thickness by a chemical vapor deposition (CVD) process. A dry etching process may be performed against the exposed field region F using the mask pattern as an etching mask, thereby forming the trench 101 at the field region F of the substrate 100.

A thermal oxidation process may be optionally performed on the bottom and the inner sidewall of the trench 101 for curing the substrate damage caused by the dry etching process, thereby forming an additional thermal oxide layer (not illustrated) on the bottom and the inner sidewall of the trench 101. For example, a thermal treatment in an atmosphere of oxygen may be performed on the substrate 100 for forming the thermal oxide layer. The thermal oxide layer may be removed from the trench 101 before forming the sidewall oxide layer, to thereby prevent or inhibit the deterioration of the step coverage in the trench 101.

Figure 4B:
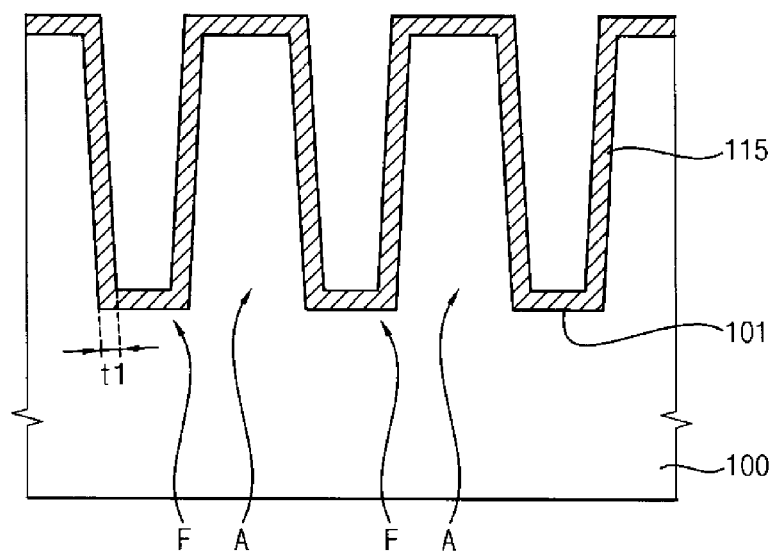

Referring to FIG. 4B, a preliminary sidewall oxide layer 115 may be formed on the bottom and inner sidewall of the trench 101 conformal with a surface profile of the substrate 100 having the trench 101. Thus, the preliminary sidewall oxide layer 115 may be formed on the bottom and the inner sidewall of the trench 101 and on a surface of the substrate 100. The preliminary sidewall oxide layer 115 may relax a mechanical stress at the inner sidewall of the trench 101 and may prevent or inhibit hydrogen atoms from being attached to the inner sidewall of the trench 101 when filling the trench 101 in a subsequent process.

For example, oxide materials having improved step coverage may be deposited onto the substrate 100 having the trench 101, and thus the preliminary sidewall oxide layer 115 may be formed conformal with the surface profile of the substrate 100. Since the deposition of the oxide materials may be performed on a whole surface of the substrate 100, the preliminary sidewall oxide layer 115 may be formed on the surface of the active region A of the substrate 100 as well as the inner sidewall and the bottom of the trench 101.

Particularly, the preliminary sidewall oxide layer 115 may have a first thickness t1 that may be uniform along the surface of the active region A and along the inner sidewall and the bottom of the trench 101. For example, the preliminary sidewall oxide layer 115 may be formed on the substrate 100 by one of a middle temperature CVD process, a high temperature CVD process and a high density plasma CVD (HDPCVD) process.

Figure 4C:
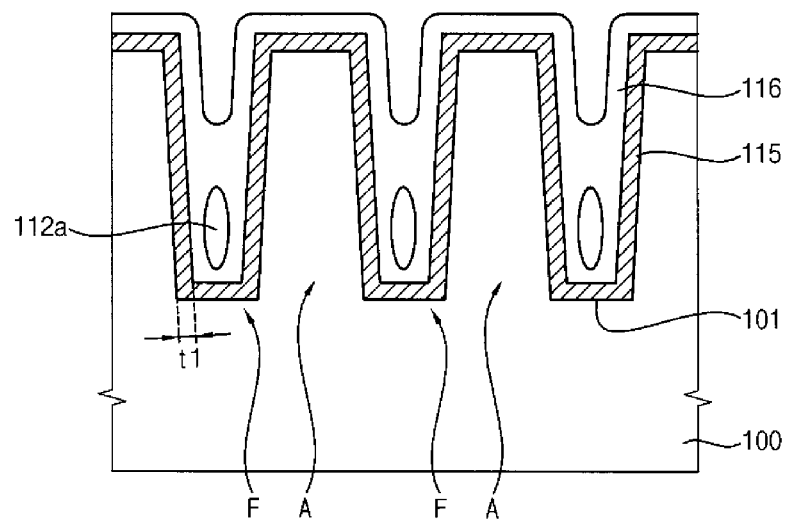

Referring to FIG. 4C, a first preliminary insulation layer 116 may be formed on the preliminary sidewall oxide layer 115 conformal with the surface profile of the substrate having the trench 101. The lower portion of the trench 101 may be filled with the first preliminary insulation layer 116 together with the first void 112a. Particularly, since the minor axis-directed trench 101 may be formed to have a relatively high aspect ratio, the first preliminary insulation layer 116 may fill the lower portion of the trench 101 in spite of the improved step coverage thereof and the first void 112a may be generated in the first preliminary insulation layer 116 due to an overhang defect of the first preliminary insulation layer 116.

For example, the first preliminary insulation layer 116 may include a liner layer for preventing or inhibiting the inner stresses at the inner sidewall of the trench 101 and the leakage current through the inner sidewall of the trench 101. In the present example embodiment, the first preliminary insulation layer 116 may include a silicon nitride layer. Silicon nitride may be deposited onto the first preliminary sidewall oxide layer 115 by a low pressure CVD (LPCVD) process, thereby forming the silicon nitride layer on the first preliminary sidewall oxide layer 115 as the liner layer.

Although not illustrated in figures, the first preliminary insulation layer 116 may be formed on the bottom and the inner sidewall of the major axis-directed trench to a uniform thickness without voids. Since the major axis-directed trench may have a greater width than the minor axis-directed trench, the first preliminary insulation layer 116 may be formed in the trench 101 conformal with the trench profile. Therefore, no overhang defect may occur in the lower portion of the major axis-directed trench due to the relatively high step coverage characteristic of the first preliminary insulation layer 116, and thus no voids may be generated at the lower portion of the major axis-directed trench. That is, the first preliminary insulation layer 116 may be formed as a uniform liner layer in the major axis-directed trench. However, when the major axis-directed trench may have a sufficient width and thus may have a relatively high aspect ratio, the lower portion of the trench may also be filled with the first preliminary insulation layer 116 together with the first voids just like the minor axis-directed trench.

Figure 4D:
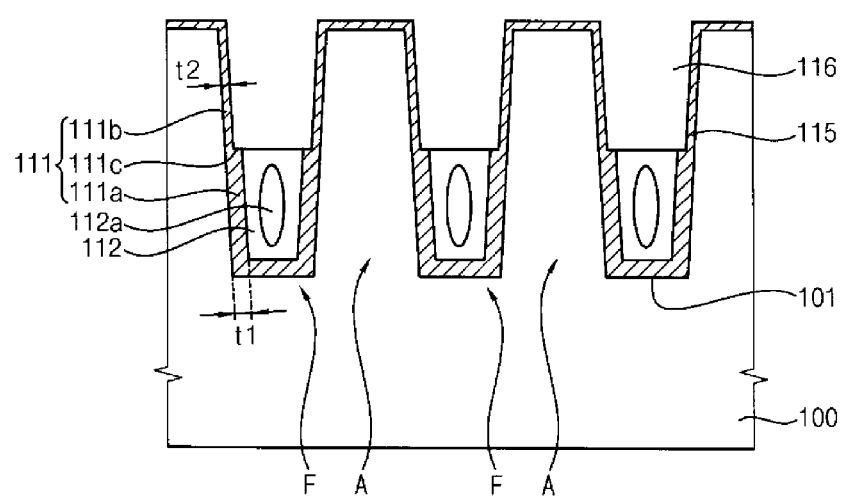

Referring to FIG. 4D, the first preliminary insulation layer 116 and the preliminary sidewall oxide layer 115 may be partially removed from the substrate 100, thereby forming the first insulation layer 112 filling the lower portion of the trench 101 and the sidewall oxide layer 111 having a different thickness at the lower portion and the upper portion of the trench 101. The sidewall oxide layer 111 may be formed on the sidewall and bottom of the trench 101 together with a stepped portion 111c between the upper portion and the lower portion of the trench 101 and the first insulation layer 112 may be defined by the sidewall oxide layer 111 and may fill the lower portion of the trench 101 together with the first void 112a.

For example, the first preliminary insulation layer 116 comprising silicon nitride may be partially removed from the preliminary sidewall oxide layer 115 by a wet etching process using a phosphoric ($H_3PO_4$) aqueous solution as an etchant. Particularly, the wet etch process against the first preliminary insulation layer 116 may be performed in such a way that the first void 112a may not be exposed to surroundings, and thus the first preliminary insulation layer 116 may remain at the lower portion of the trench 101, thereby forming the first insulation layer 112 having the first void 112a.

While the first preliminary insulation layer 116 may be etched off along the depth of the trench 101 in the wet etching process, the preliminary sidewall oxide layer 115 on the surface of the active region A and the upper sidewall of the trench 101 may also be etched off by the same wet etching process. However, since the etchant of phosphoric ($H_3PO_4$) aqueous solution may have a lower etching rate against oxides than silicon nitrides, the preliminary sidewall oxide layer 115 may be etched less than the first preliminary silicon layer 116 in the same wet etching process. For that reason, the preliminary sidewall oxide layer 115 may be partially removed from the surface of the active region A and the upper sidewall of the trench 101 to a second thickness t2 smaller than the first thickness t1 while the first preliminary insulation layer 116 may be etched to the first insulation layer 112.

In the present example embodiment, the wet etching process may be performed in such a way that the surface of the active region A may not be exposed and thus the preliminary sidewall oxide layer 115 may remain on the surface of the active region A when completing the wet etching process against the first preliminary insulation layer 116. Since the surface of the active region A may be covered with the preliminary sidewall oxide layer 115, the active region A may not be etched off in the wet etching process.

Thus, the preliminary sidewall oxide layer 115 may be formed into the sidewall oxide layer 111 having a lower sidewall oxide layer 111a, an upper sidewall oxide layer 111b and the stepped portion 111c. The stepped portion 111c may be coplanar with an upper surface of the first insulation layer 112. The upper sidewall oxide layer 111b may be formed on the upper sidewall of the trench 101 to the second thickness t2 above the stepped portion 111c and the lower sidewall oxide layer 111a may be formed on the lower sidewall of the trench 101 to the first thickness t1 below the stepped portion 111c.

Figure 4E:
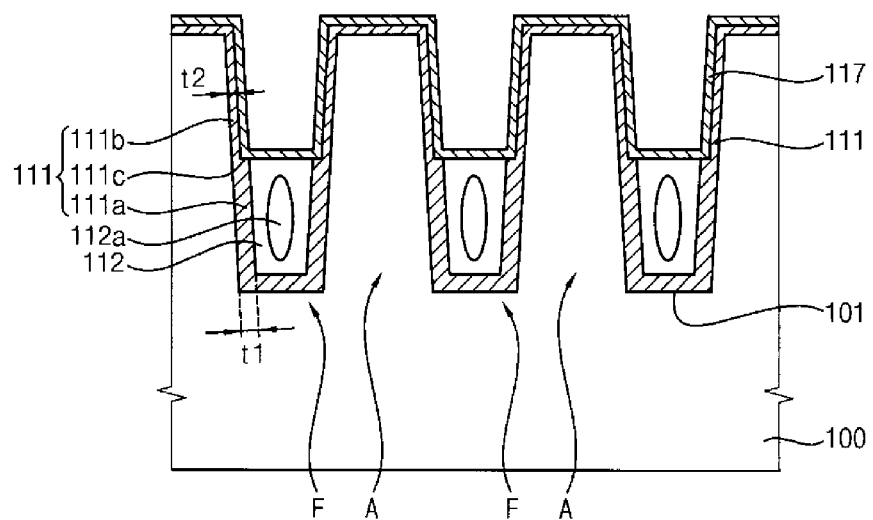

Referring to FIG. 4E, a preliminary separation layer 117 may be formed on the upper sidewall oxide layer 111b, the stepped portion 111c and the first insulation layer 112.

For example, the preliminary separation layer 117 may comprise oxide having improved step coverage and may be formed along the surface of the upper sidewall oxide layer 111b. Therefore, the preliminary separation layer 117 may compensate for the smaller thickness of the upper sidewall oxide layer 111b. In the present example embodiment, the preliminary separation layer 117 may comprise the same silicon oxide as the upper sidewall oxide layer 111b and may be formed by the same process as for the first preliminary sidewall oxide layer 115.

Particularly, the preliminary separation layer 117 may have such sufficient step coverage that the upper sidewall oxide layer 111b and the stepped portion 111c of the sidewall oxide layer 111 and the first insulation layer 112 may be uniformly covered with the preliminary separation layer 117. Thus, the preliminary separation layer 117 may be formed to a uniform thickness on the upper sidewall oxide layer 111b, the stepped portion 111c and the second insulation layer 112. Therefore, the first insulation layer 112 may be isolated by the preliminary separation layer 117.

Figure 4F:
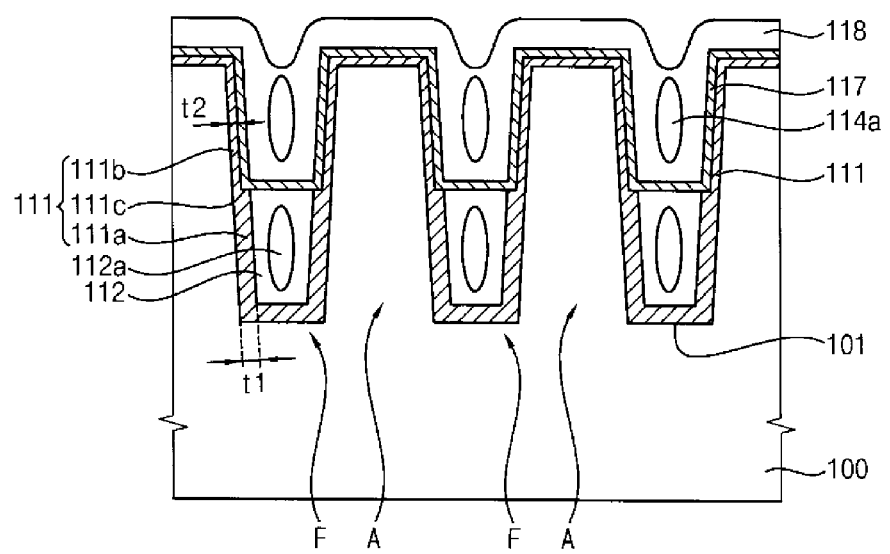

Referring to FIG. 4F, a second preliminary insulation layer 118 may be formed on the preliminary separation layer 117 and thus the upper portion of the trench 101 may be filled with the second preliminary insulation layer 118 having the second void 114a.

Since the first preliminary insulation layer 116 may be removed from the upper portion of the trench 101 by the wet etching process, no liner layer may be formed on the upper portion of the trench 101. Thus, crystal defects caused by volume expansion or junction leakage currents caused by hydrogen bonding may occur at the upper portion of the trench 101. However, the second preliminary insulation layer 118 may function as the liner layer at the upper sidewall of the trench 101 together with the preliminary separation layer 117, thereby sufficiently preventing or inhibiting the crystal defects and the junction leakage currents at the upper portion of the trench 101. In the present example embodiment, the second preliminary insulation layer 118 may be formed by the same process as the first preliminary insulation layer 116 and thus the first and the second preliminary insulation layers 116 and 118 may comprise silicon nitride.

Since the trench 101 may have a relatively high aspect ratio, the second preliminary insulation layer 118 may fill the upper portion of the trench 101 in spite of the improved step coverage and the second void 114a may be generated in the second preliminary insulation layer 118 due to an overhang defect of the second preliminary insulation layer 118. That is, the upper portion of the trench 101 may be filled with the second preliminary insulation layer 118 together with the second void 114a.

Figure 4G:
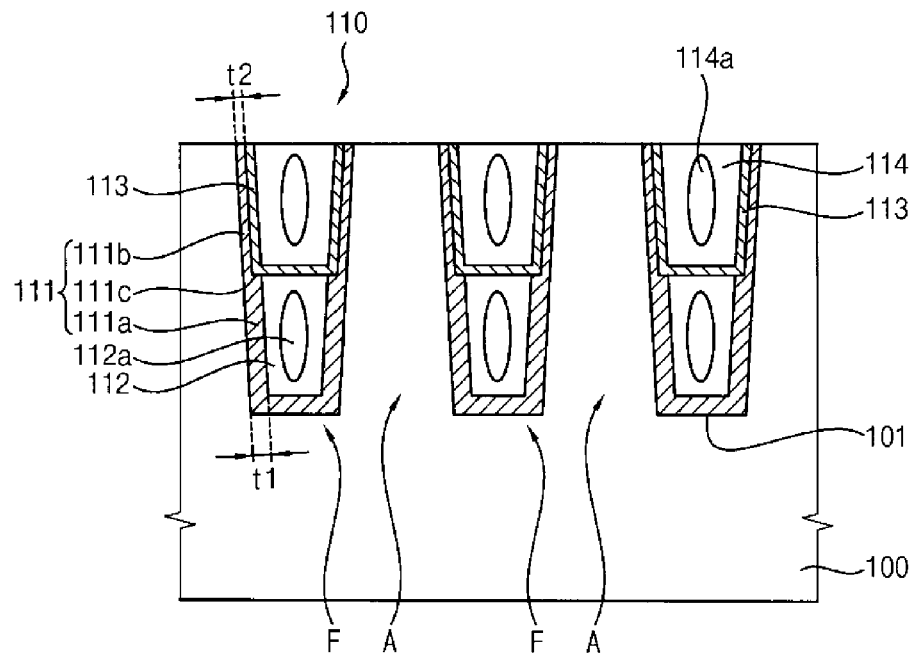

Referring to FIG. 4G, the second preliminary insulation layer 118 and the preliminary separation layer 117 may be planarized until an upper surface of the active region A of the substrate 100 may be exposed, thereby forming the separation layer 113 covering the first insulation layer 112 and the sidewall oxide layer 111 and the second insulation layer 112 filling the upper portion of the trench 101 and defined by the separation layer 113. The second void 114a may be formed in the second insulation layer 114.

For example, a chemical mechanical polishing (CMP) process may be performed against the second preliminary insulation layer 118 and the preliminary separation layer 117 until the upper surface of the active region A of the substrate A. Thus, the preliminary separation layer 117 may remain on an upper surface of the first insulation layer 112 and on the stepped portion 111c and upper sidewall oxide layer 111b, thereby forming the separation layer 113 that may define the upper portion of the trench 101. The preliminary second insulation layer 118 may remain just in the upper portion of the trench 101, thereby forming the second insulation layer 114 filling the upper portion of the trench 101.

Particularly, the second void 114a may be formed in the second insulation layer 114 due to the overhang defect caused by the high aspect ratio of the trench 101.

Accordingly, the inner sidewall of the trench 101 may be covered with the sidewall oxide layer 111 and the separation layer 113 and the trench 101 may be filled with the first and the second insulation layers 112 and 114, thereby forming the device isolation layer 110 in the trench 101. The first and the second insulation layers 112 and 114 may be separated from each other by the separation layer 113 in the trench 101 and thus the first void 112a and the second void 114a may also be separated from each other by the separation layer 113.

That is, the trench 101 may be filled with the liner layers such as the first and the second insulation layers 112 and 114 without additional gap-fill layers and the first and the second voids 112a and 114a in the device isolation layer 110, even if provided, may be separated from each other by the separation layer 113. As a result, although the first and the second voids 112a and 114a may be filled with conductive materials and the conductive fillers may be formed in the device isolation layer 110, the conductive fillers may be electrically separated from each other by the separation layer 113. Thus, the leakage current may be sufficiently prevented or inhibited from passing through the device isolation layer 110 in spite of the conductive fillers in the device isolation layer 110.

Although not illustrated in figures, an additional gap-fill layer may be further filled in the major axis-directed trench after forming the second preliminary insulation layer 118 since the major axis-directed trench may have a greater width than the minor axis-directed trench and thus the major axis-directed trench may have a smaller aspect ratio than the minor axis-directed axis. In such a case, the sidewall oxide layer and the separation layer may function as a trench oxide layer covering the inner sidewall of the trench 101 and the first and the second insulation layers may function as a trench liner layer covering the oxide layer in the trench. The trench of which the inner sidewall may be covered with the trench oxide layer and the trench liner layer may be filled with the gap-fill layer.

The gate trench 201 may be formed on the active region A of the substrate 100 and the gate structure 200 may be formed in the gate trench 201. Particularly, the device isolation layer 110 may be partially removed by an etching process for forming the gate trench 201, e.g., an over-etching process, against the device isolation layer 110, and the first and the second voids 112a and 114a may be exposed.

The over-etching against the device isolation layer 110 during the etching process for forming the gate trench 201 may be more defective along the minor axis direction rather than along the major axis direction. Thus, the processing steps for forming the gate structure 200 will be described in detail with reference to cross-sectional views of the memory device 1000 cut along the minor axis of the device isolation layer 110.

FIGS. 5A to 5C are cross sectional views illustrating the processing steps for forming the gate structure 200 of the memory device 1000 shown in FIG. 1. FIGS. 5A to 5C are cross-sectional views cut along a line III-III' of the memory device shown in FIG. 1.

Referring to FIG. 5A, the gate trench 201 may be formed on the active regions A1 and A2 defined by the device isolation layer 110. For example, a pair of the gate trench 201 may be formed at both peripheral portions of a single one of the active regions A1 and A2 along the major axis Ma and may be spaced apart from each other on the same one of the active regions A1 and A2. In contrast, the gate trenches 201 on the neighboring active regions A may be spaced apart from each other by the minor device isolation layer along the minor axis direction of the active region A. A mask pattern (not illustrated) may be formed on one of the active regions A1 and A2 and at least one of the active regions A1 and A2 may be partially removed by an etching process using the mask pattern as an etching mask, thereby forming the gate trench 201 at which the BCAT may be formed in subsequent processes. For example, the etching process may include an anisotropic etching process such as a reactive ion etching (RIE) process and a plasma etching process. Otherwise, the etching process may include a tapered etching process.

In the present example embodiment, first and second active regions A1 and A2 may be spaced apart by the minor device isolation layer 110 along the minor axis direction and the first and the second gate trenches 201a and 201b may be formed on the first and the second active regions, respectively. Thus, the first and the second gate trenches 201a and 201b may be adjacent to each other along the line III-III' and may be spaced apart by the minor device isolation layer 110.

The device isolation layer 110 close to the first gate trench 201a may be partially over etched off in the etching process for forming the first gate trench 201a and thus the first and the second voids 112a and 114a may be exposed to the first gate trench 201a. While the present example embodiment discloses that the first and the second voids 112a and 114a may be exposed to the first gate trench 201a, the voids 112a and 114a may also be exposed to the second gate trench 201b or to both of the first and the second gate trenches 201a and 201b.

Referring to FIG. 5B, the gate insulation layer 210 may be formed on the inner sidewall and the bottom surface of the gate trench 201.

For example, a thermal oxidation process or a CVD process may be performed onto the substrate 100 having the gate trench 201, thereby forming a silicon oxide layer on the inner sidewall and the bottom surface of the gate trench 201. An additional oxide layer, not the silicon oxide layer, may be further formed on the sidewall oxide layer 111 and the separation layer 113 as well as on the first and the second insulation layers 112 and 114 in the process for forming the silicon oxide layer in the gate trench 201. A relatively small portion of the additional oxide layer may also be formed on an inner surface of the first and the second voids 112a and 114a. However, the first and the second voids 112a and 114a may not be filled with the additional oxide layer. Thereafter, a buffer insulation layer (not illustrated) may be formed on the substrate 100 in such a configuration that a plurality of openings may be arranged in correspondence to the gate trenches of the substrate.

Although not shown in figures, the buffer insulation layer may be firstly formed on the substrate 100, and then the gate insulation layer may be formed on the buffer insulation layer conformal with the surface profile of the buffer insulation layer in such a way that the gate insulation layer may be formed on the inner sidewalls of the openings and the gate trenches, the bottom of the gate trench and an upper surface of the buffer insulation layer.

Referring to FIG. 5C, the gate conductive layer 220 may be formed at a lower portion of the gate trench 201 and the capping layer 230 may be formed at an upper portion of the gate trench 201, thereby forming the gate structure 200 in the gate trench 201.

For example, a conductive layer (not illustrated) may be formed on the buffer insulation layer to a sufficient thickness to fill the gate trench 201 and the opening of the buffer insulation layer, and the conductive layer and the gate insulation layer 210 may be partially removed from the substrate 100 by an anisotropic etching process until the conductive layer may remain at the lower portion of the gate trench 201, thereby forming the gate conductive layer 220 at the lower portion of the gate trench 201. Particularly, the thickness of the gate conductive layer 220 may be determined by a thickness of the buffer insulation layer in view of a depth of the impurity layer 310 (see FIG. 2B) at the source/drain region of the substrate 100.

The conductive layer may comprise conductive materials such as polysilicon, metal and metal nitride and may be formed by deposition process or a sputtering process. The deposition process may include a chemical vapor deposition (CVD) process including a plasma enhanced CVD (PECVD) process, a high density plasma CVD (HDPCVD) process and an organic metal CVD process and an atomic layer deposition (ALD) process.

While forming the conductive layer on the substrate 100, the conductive materials may also be deposited into the first and the second voids 112a and 114a exposed to the gate trench 201, thereby forming the first and the second conductive fillers 112b and 114b.

That is, the conductive layer may be unexpectedly formed inside of the device isolation layer 110 and the conducive residual fillers 112b and 114b may be provided in the voids 112a and 114a of the device isolation layer 110 as leakage spots.

However, the first and the second conductive fillers 112b and 114b may be electrically separated by the separation layer 113 in the device isolation layer 110, and thus the leakage current may not pass from the second conductive filler 114b to the first conductive filler 112b when the leakage current passes to the second conductive filler 114b, thereby preventing or inhibiting the leakage path in the device isolation layer 110. Therefore, although the conductive fillers may be formed inside the device isolation layer according to the downsizing of the device isolation layer, the leakage current may be sufficiently prevented or inhibited from passing through the conductive fillers in the device isolation layer. That is, the leakage path may be sufficiently prevented or inhibited in the device isolation layer in spite of the conductive residual fillers therein.

The capping layer 230 may be formed on the gate conductive layer 220 in such a way that the upper portion of the gate trench 201 may be filled with the capping layer 230, thereby forming the buried gate structure 200 in the gate trench 201. After forming the gate conductive layer 220 at the lower portion of the gate trench 201, a preliminary capping layer 230 may be formed on the buffer insulation layer to a sufficient thickness to fill the upper portion of the gate trench 201 and the opening of the buffer insulation layer. The preliminary capping layer may be planarized until the upper surface of the substrate 100 may be exposed and may remain just in the upper portion of the gate trench 201.

In the present example embodiment, the buried gate structure 200 may function as a gate structure for the BCAT and the capping layer 230 may protect the buried gate conductive layer 220 in subsequent processes. The capping layer 230 may comprise photo-resist materials or silicon nitride.

After forming a pair of the buried gate structures 200 at both peripheral portions of the one of the active regions A1 and A2 along the major axis direction, impurities may be implanted onto at least one of the active regions A1 and A2 around the buried gate structure 200, thereby forming the impurity region around the gate structure 200.

Figure 6A:
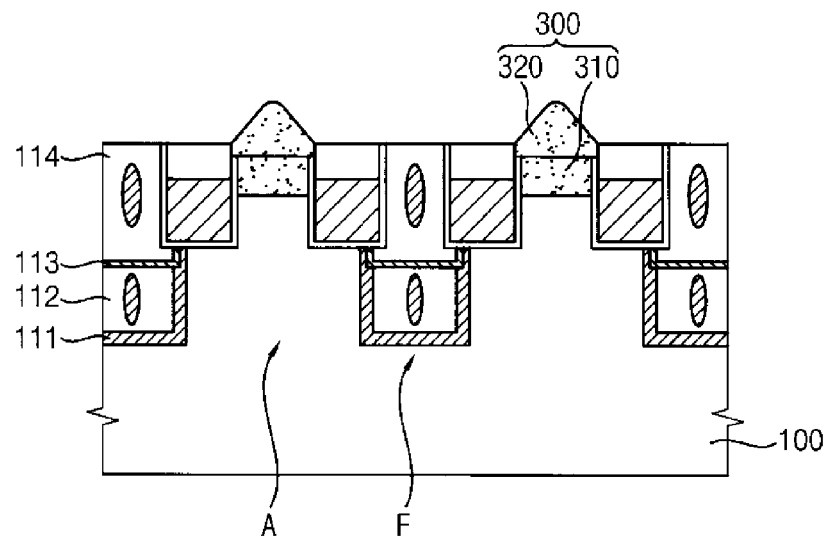
FIGS. 6A and 6B are cross-sectional views illustrating processing steps for forming the impurity region on the active region of the memory device shown in FIG. 1.
Figure 6B:
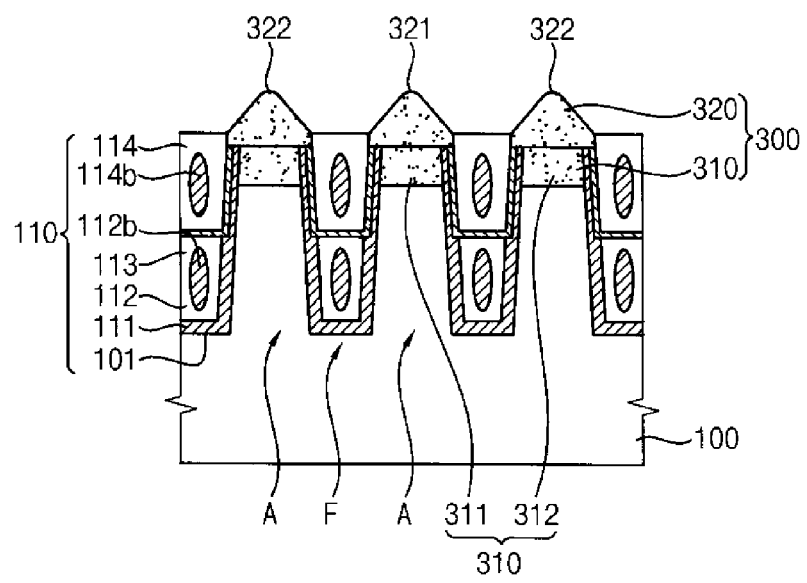

FIGS. 6A and 6B are cross-sectional views illustrating processing steps for forming the impurity region on the active region of the memory device shown in FIG. 1. FIG. 6A is a cross-sectional view cut along a line I-I' of the memory device shown in FIG. 1 and FIG. 6B is a cross-sectional view cut along a line II-II' of the memory device shown in FIG. 1.

Referring to FIGS. 6A and 6B, n-type or p-type impurities may be implanted in the active region A adjacent to the buried gate structure 200 by an ion implantation process, thereby forming an impurity layer 310 on the active region A of the substrate 100.

The capping layer 230 (see FIG. 2A) may function as a mask layer for the ion implantation process, and thus the impurities may be sufficiently prevented or inhibited being implanted onto the gate conductive layer 220. The concentration of the impurities may be varied the characteristics of the memory device 1000 and the implantation energy of the implantation process may be determined in such a way that the lower portion of the impurity layer 310 may be lower than an upper surface of the gate conductive layer 220.

Since a pair of the buried gate structures 200 may be formed on the active region along the major axis Ma, a first impurity layer 311 may be formed on a central portion of the active region A between the pair of the gate structures 200 and a second impurity layer 312 may be formed at both end portions of the active region A adjacent to each of the gate structures 200.

For example, when the memory device 100 may function as a DRAM device, the first impurity layer 311 may function as a drain region making electrical contact with a bit line structure and the second impurity layer 312 may function as a source region making electrical contact with a capacitor structure.

In a modified example embodiment, a contact pad may be further formed on the impurity layer 310, thereby enlarging a contact area between the impurity layer 310 and the interconnection. An upper portion of the impurity region 310 may be etched to thereby form an opening through the sidewalls of the second insulation layer 114 and the capping layer 230. Then, the contact pad 320 may be formed on the upper portion of the impurity layer 310 by a selective epitaxial process. In the present example embodiment, the contact pad 320 may include a first pad 321 that may be formed on the first impurity layer 311 and a second pad 322 that may be formed on the second impurity layer 312. Therefore, the contact pad 310 may be formed across the active region A and a portion of the device isolation layer 110.

Thereafter, an insulation interlayer may be (not shown) formed on the contact member 300 including the impurity layer 310 and an interconnection may be formed through the insulation interlayer.

Figure 7A:
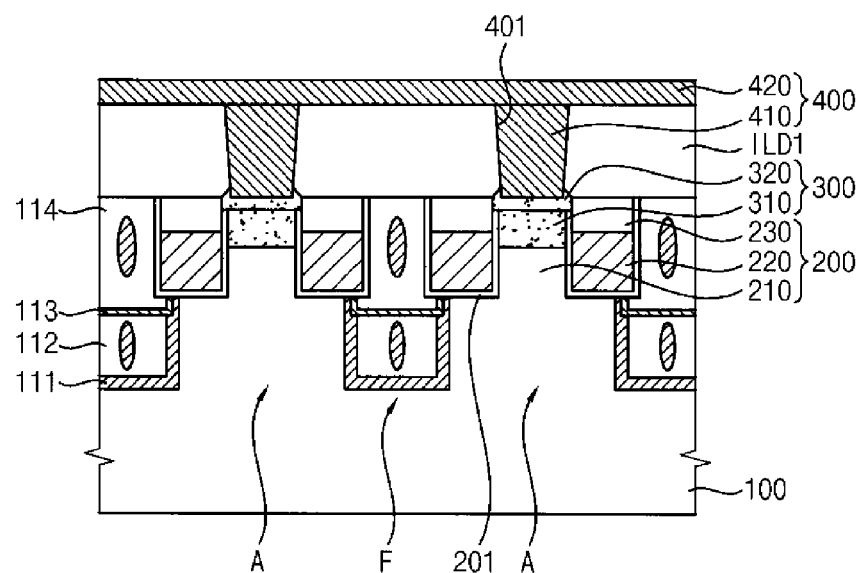
FIGS. 7A and 7B are cross-sectional views illustrating the processing steps for forming the interconnection of the memory device shown in FIG. 1.
Figure 7B:
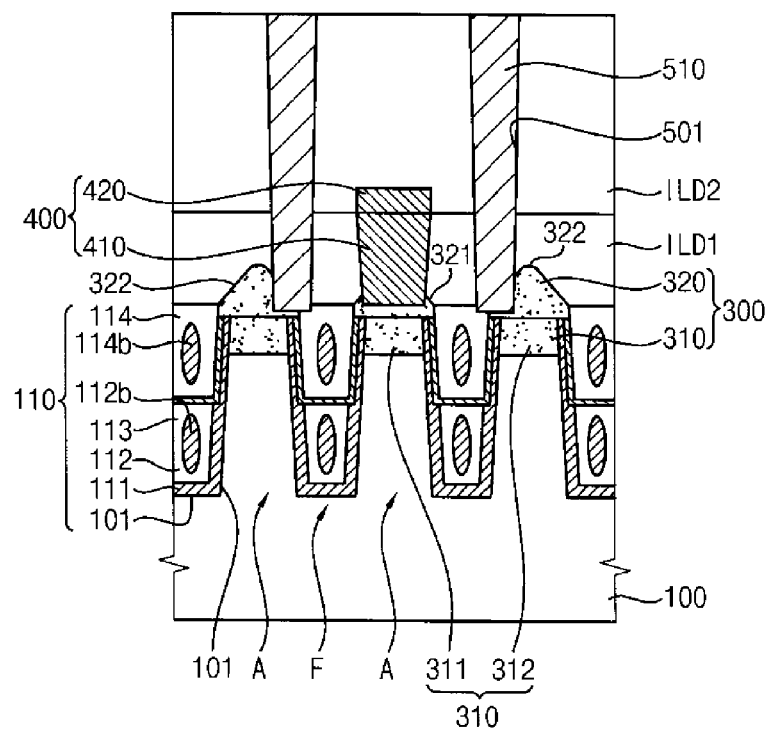

FIGS. 7A and 7B are cross-sectional views illustrating the processing steps for forming the interconnection of the memory device shown in FIG. 1. FIG. 7A is a cross-sectional view cut along the line I-I' of the memory device shown in FIG. 1 and FIG. 7B is a cross-sectional view cut along the line II-II' of the memory device shown in FIG. 1.

Referring to FIG. 7A, the first insulation interlayer ILD1 may be formed on the substrate 100 having the buried gate structure 200 and the contact member 300. The first insulation interlayer ILD1 may be partially removed from the substrate 100 to thereby form a first opening 401 through which the first impurity layer 311 may be exposed at the central portion of the active region A.

The first opening 401 may be filled with a first interconnector 410 and a conductive line 420 may be formed on the first insulation interlayer ILD1 in such a way that the conductive line 420 may make contact with the first interconnector 410 and may extend in the second direction Y. In the present example embodiment, the first interconnector 410 may include a bit line contact making contact with a drain region of the memory device 1000 and the conductive line 420 may include a bit line of the memory device 1000, thereby forming a bit line structure of the memory device 1000.

Particularly, the first pad 321 and/or the first impurity layer 311 may be partially removed from the substrate 100 when forming the first opening 401. Thus, the first interconnector 410 may make contact with the first impurity layer 311 and/or the first pad 321.

Referring to FIG. 7B, the second insulation interlayer ILD2 may be formed on the first insulation interlayer ILD1 to a sufficient thickness to cover the first conductive line 420. The first and the second insulation interlayers ILD1 and ILD2 may be partially removed from the substrate 100 to thereby form a second opening 501 through which the second impurity layer 312 may be exposed at both end portions of the active region A.

The second opening 501 may be filled with a second interconnector 510 and an electronic structure (not illustrated) may be formed on the second insulation interlayer ILD2 in such a way that the electronic structure may make contact with the second interconnector 510. In the present example embodiment, the second interconnector 510 may include a storage node contact making contact with a source region of the memory device 1000 and the electronic structure may include a capacitor 600 in FIG. 2B of the memory device 1000, thereby forming a capacitor structure of the memory device 1000.

The second pad 322 and/or the second impurity layer 312 may be partially removed from the substrate 100 when forming the second opening 501. Thus, the second interconnector 510 may make contact with the second impurity layer 312 and/or the second pad 322.

Particularly, when the second pad 322 may be removed from the substrate 100 in forming the second opening 501, the second insulation layer 114 of the device isolation layer 110 adjacent to the second pad 322 may also be partially removed from the substrate 100. Thus, the second conductive residual filler 114b may be exposed at the upper portion of the device isolation layer 110. Therefore, the second interconnector 510 may also make contact with the second conductive residual filler 114b in the second opening 501. As a result, the second interconnector 510 may also be connected to the second conductive residual filler 114b as well as to the second pad 322 and the second impurity layer 312.

However, since the second conductive residual filler 114b may be separated from the first conductive residual filler 112b by the separation layer 113 in the device isolation layer 110, the leakage current leaked from the second interconnector 510 to the second conductive residual filler 114b may be prevented or inhibited from passing to the first conductive residual filler 112b. Thus, leakage path may be sufficiently prevented or inhibited in spite of the conductive fillers 112b and 114b in the device isolation layer 110, thereby improving leakage characteristics of the memory device.

Thereafter, the electronic structure such as the capacitor structure may be formed on the second insulation interlayer ILD2 in such a way that the capacitor structure may make contact with the second interconnector 510 such as the storage node contact. Then, upper wirings (not illustrated) may be formed on other insulation interlayers covering the capacitor structure, thereby forming the memory device 1000.

According to the method of manufacturing the memory device, the device isolation layer may be formed to have lower and upper sidewall oxide layers having different thickness at lower and upper portions of device isolation trench, first and second insulation layers filling the lower and the upper portions of the device isolation trench and a separation layer separating the first and the second insulation layers. The first and second insulation layers may have first and second voids therein, respectively, and thus the first and second voids may also be separated from each other by the separation layer. Accordingly, although conductive materials may be filled with the first and the second voids and thus first and second conductive residual fillers may be formed at the first and the second insulation layers, respectively, the first and the second conductive residual fillers may also be separated by the separation layer and thus the leakage current leaked to the second filler may be sufficiently prevented or inhibited from passing to the first filler. That is, the leakage path may be sufficiently prevented or inhibited in the device isolation layer in spite of the conductive residual fillers therein.

Particularly, in case of the memory device including BCATs, the minor device isolation layer may be over-etched when forming the gate trench on the active region and the first and second voids in the minor device isolation layer may be exposed. Thus, the first and second voids may be unexpectedly filled with conductive materials for the gate structure and the conductive residual fillers may be formed in the minor device isolation layer. In such a case, when the storage node contact may make contact with an upper conductive residual filler and a leakage current may pass to the upper conductive residual filler from the storage node contact, the leakage current may be sufficiently prevented or inhibited from passing to the lower conductive residual filler by the separation layer. That is, the leakage path may be sufficiently prevented or inhibited in the device isolation layer in spite of the conductive residual fillers therein.

Electronic System Having the Memory Device

Figure 8:
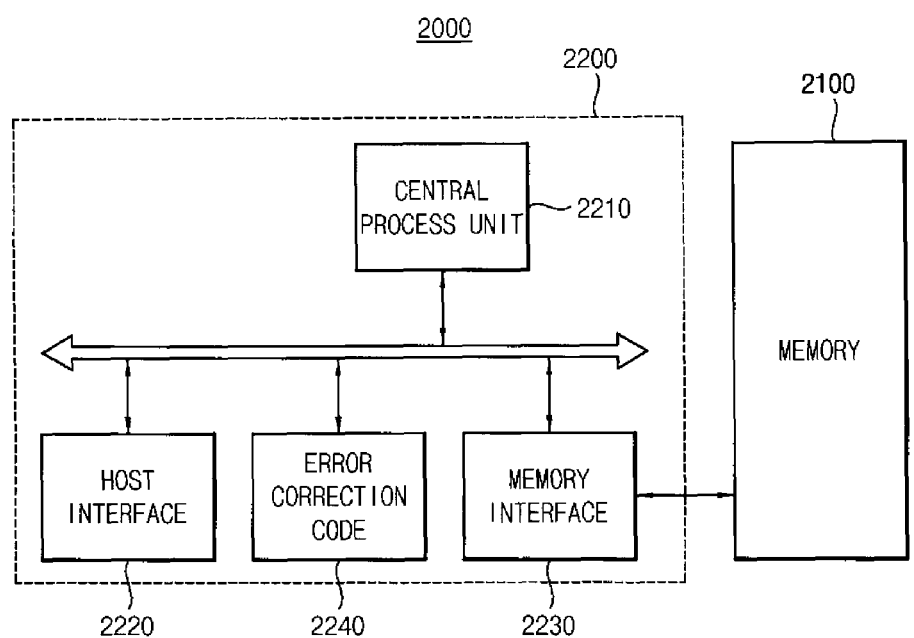
FIG. 8 is a structural view illustrating a memory card having the memory device shown in FIG. 1 in accordance with an example embodiment.

FIG. 8 is a structural view illustrating a memory card having the memory device shown in FIGS. 1 to 3 in accordance with an example embodiment.

Referring to FIG. 8, the memory card 2000 in accordance with an example embodiment may include the memory device 1000 shown in FIGS. 1 to 3. For example, the memory card 2000 may include a memory unit 2100 and a memory controller 2200. The memory unit 2100 may include a plurality of the memory devices to which electronic data may be transferred to an external host (not illustrated). The electronic data may be stored in the memory unit 2100. The memory controller 2200 may be connected to the host and may control the data transfer between the memory unit 2100 and the host.

The memory unit 2100 may include the same memory devices 1000 as described in detail with reference to FIGS. 1 to 3 and the electronic data processed in the host may be stored in the memory unit 2100. The capacity of the memory unit 2100 may be determined by the number and the capacity of each memory device 1000 and the performance of the memory card may be determined by the capacity of the memory unit 2100.

The memory controller 2200 may include a central process unit (CPU, 2210) for processing the control of data transfer between the host and the memory unit 2100, a host interface 2220 having a data transfer protocol of the host, a memory interface 2230 connected to the memory unit 2100 and an error correction code 2240 for detecting and correcting errors of the electronic data in the memory unit 2100. An additional memory device for the CPU 2110 may be further provided with the memory card 2000. For example, a static random access memory (SRAM) device may be provided as an operation memory device of the CPU 2110.

Each of the memory devices 1000 in the memory unit 2100 may include upper and lower conductive fillers in the device isolation layer that may be separated from each other by the separation layer. Thus, although the leakage currents may be leaked to the upper conductive filler from the interconnector of the memory device 1000, the leakage currents may be sufficiently prevented or inhibited from passing to the lower conductive filler, thereby preventing or inhibiting leakage path in the device isolation layer. Therefore, the gate leakage may be minimized or reduced in spite of the relatively high integration degree and relatively high operation speed of the memory device, thereby improving the operation stability of the memory card 2000. Particularly, when the memory device 1000 may include a plurality of BCATs, the integration degree, the capacity, the operation speed and the system stability of the memory card 2000 may be sufficiently improved.

Figure 9:
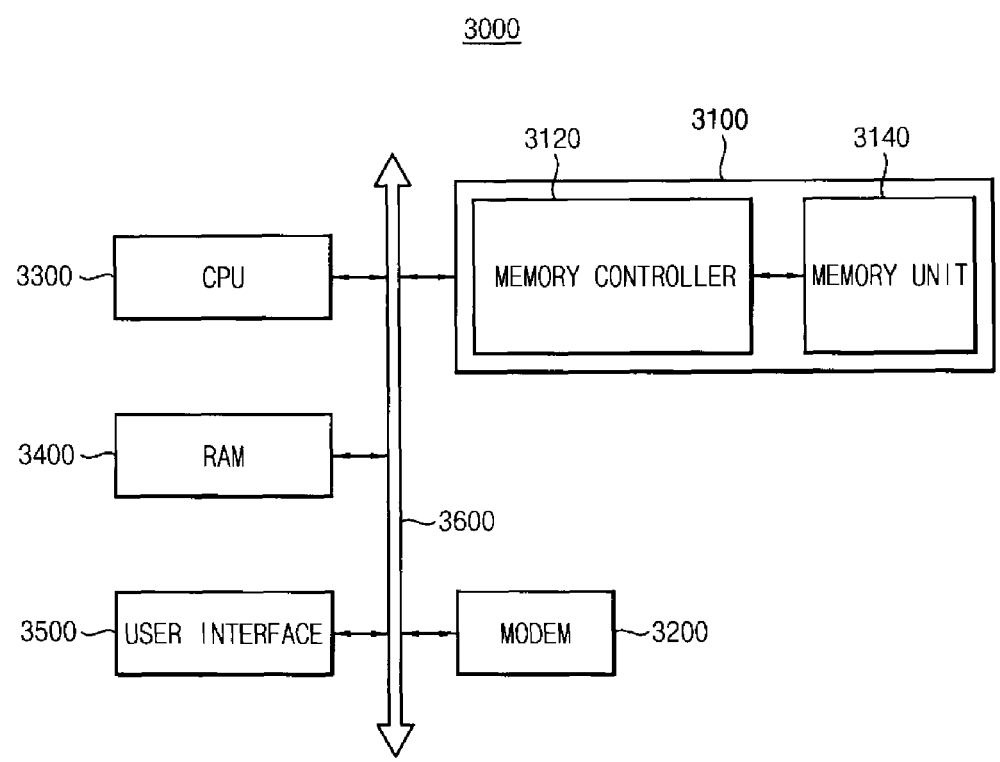
FIG. 9 is a structural view illustrating an information processing system having the memory device shown in FIG. 1 in accordance with an example embodiment.

FIG. 9 is a structural view illustrating an information processing system having the memory device shown in FIGS. 1 to 3 in accordance with an example embodiment.

Referring to FIG. 9, the information processing system 3000 in accordance with an example embodiment may include the memory device 1000 shown in FIGS. 1 to 3. In the present example embodiment, the information processing system 3000 may include various mobile systems such as a smart phone and a tablet computer and traditional computer systems such as a laptop computer system and a desktop computer system.

For example, the information processing system 3000 may include a main memory system 3100 for storing data and a modem 3200, a central process unit (CPU) 3300, a random access memory (RAM) 3400 and a user interface 3500 that may be connected to the memory unit 3100 via a data bus line 3600. The main memory system 3100 may store electronic data that may be processed at the CPU 3200 or may be transferred from the external data source. The main memory system 3100 may include a memory unit 3140 and a memory controller 3120. The memory unit 3140 and the memory controller 3120 may have the same structure as the memory card 2000 shown in FIG. 8. The memory unit 3140 may include the same memory devices 1000 as described in detail with reference to FIGS. 1 to 3.

Each of the memory devices 1000 in the memory unit 3140 may include upper and lower conductive fillers in the device isolation layer that may be separated from each other by the separation layer. Thus, although the leakage currents may be leaked to the upper conductive filler from the interconnector of the memory device 1000, the leakage currents may be sufficiently prevented or inhibited from passing to the lower conductive filler, thereby preventing or inhibiting leakage path in the device isolation layer. Therefore, the gate leakage may be minimized or reduced in spite of the relatively high integration degree and relatively high operation speed of the memory device, thereby improving the operation stability of the information processing system 3000.

The information processing system 3000 may be provided with a memory card, a solid state disk, a camera image sensor and various application chipsets (AP). For example, when the solid state disk (SSD) may be provided as the memory system 3100, the information processing system 3000 may process and store a relatively great volume of data with relatively high stability and reliability.

According to the present various example embodiments, the device isolation layer may be formed to have lower and upper sidewall oxide layers having different thickness at lower and upper portions of device isolation trench, first and second insulation layers filling the lower and the upper portions of the device isolation trench and a separation layer separating the first and the second insulation layers. The first and second insulation layers may have first and second voids therein, respectively, and thus the first and second voids may also be separated from each other by the separation layer. Accordingly, although conductive materials may be filled with the first and the second voids and thus first and second conductive residual fillers may be formed at the first and the second insulation layers, respectively, the first and the second conductive residual fillers may also be separated by the separation layer and thus the leakage current leaked to the second filler may be sufficiently prevented or inhibited from passing to the first filler. That is, the leakage path may be sufficiently prevented or inhibited in the device isolation layer in spite of the conductive residual fillers therein.

Particularly, in case of the memory device including BCATs, the minor device isolation layer may be over-etched when forming the gate trench on the active region and the first and second voids in the minor device isolation layer may be exposed. Thus, the first and second voids may be unexpectedly filled with conductive materials for the gate structure and the conductive residual fillers may be formed in the minor device isolation layer. In such a case, when the storage node contact may make contact with the upper conductive residual filler and the leakage currents may pass to the upper conductive residual filler from the storage node contact, the leakage currents may be sufficiently prevented or inhibited from passing to the lower conductive residual filler by the separation layer. That is, the leakage path may be sufficiently prevented or inhibited in the device isolation layer in spite of the conductive residual fillers therein.

The present example embodiments of the memory device may be applied to various electronic systems including semiconductor devices and IC chips such as telecommunication systems and storage systems.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory device comprising:
   a substrate having an active region and a field region defining the active region, the field region having a device isolation trench;
   a device isolation layer in the device isolation trench of the substrate, the device isolation layer including,
   a first insulation layer in a lower portion of the device isolation trench, the first insulation layer having a first conductive filler in a first void,
   a second insulation layer in an upper portion of the device isolation trench, the second insulation layer having a second conductive filler in a second void, and
   a separation layer between the first insulation layer and the second insulation layer;
   a gate structure on the active region of the substrate, the gate structure including a buried gate conductive layer;
   an impurity layer on the active region and adjacent to the gate structure; and
   a conductive interconnector contacting the impurity layer, wherein the first and the second conductive fillers include a same material as the buried gate conductive layer.

2. The memory device of claim 1, wherein the gate structure comprises:
   a buried structure on an inner sidewall and a bottom surface of a gate trench of the active region of the substrate, the buried structure including a buried gate insulation layer; and
   a capping layer on the buried gate conductive layer, the capping layer filling an upper portion of the gate trench,
   wherein the buried gate conductive layer is on the buried gate insulation layer and filling a lower portion of the gate trench.

3. The memory device of claim 2, wherein the impurity layer is on surface portions of the active region at side portions of the buried structure in order to form a buried channel array transistor (BCAT) on the active region of the substrate.

4. The memory device of claim 2, wherein the device isolation layer further comprises:
   a sidewall oxide layer on an inner sidewall and a bottom surface of the device isolation trench,
   wherein the separation layer is on a portion of the sidewall oxide layer and on an upper surface of the first insulation layer, the first insulation layer is defined by the sidewall oxide layer and the separation layer, and the second insulation layer is enclosed by the separation layer.

5. The memory device of claim 4, wherein the sidewall oxide layer includes:
   a lower oxide layer having a first thickness from the bottom surface and the inner sidewall of the device isolation trench;
   an upper oxide layer having a second thickness from the inner sidewall of the device isolation trench, the second thickness less than the first thickness; and
   a stepped portion between the lower oxide layer and the upper oxide layer.

6. The memory device of claim 4, wherein the sidewall oxide layer and the separation layer include silicon oxide and the first insulation layer and the second insulation layer include silicon nitride.

7. The memory device of claim 1, wherein the conductive interconnector contacts the second conductive filler of the device isolation layer.

8. A structure comprising:
   a device isolation layer in a device isolation trench of a substrate, the device isolation layer including,
   a first insulation layer in a lower portion of the device isolation trench, the first insulation layer having a first conductive filler filling a first void formed therein,
   a second insulation layer in an upper portion of the device isolation trench, the second insulation layer having a second conductive filler filling a second void formed therein, and a separation layer between the first insulation layer and the second insulation layer.

9. The structure of claim 8, further comprising:
a sidewall oxide layer on an inner sidewall and a bottom surface of the device isolation trench,
wherein the separation layer is on a portion of the sidewall oxide layer and on an upper surface of the first insulation layer, the first insulation layer is defined by the sidewall oxide layer and the separation layer, and the second insulation layer is enclosed by the separation layer.

10. The structure of claim 9, wherein the sidewall oxide layer comprises:
a lower oxide layer having a first thickness from the bottom surface and the inner sidewall of the device isolation trench;
an upper oxide layer having a second thickness from the inner sidewall of the device isolation trench, the second thickness less than the first thickness; and
a stepped portion between the lower oxide layer and the upper oxide layer.

11. The structure of claim 8, further comprising:
a substrate having an active region and a field region defining the active region;
a gate structure on the active region of the substrate;
an impurity layer on the active region and adjacent to the gate structure; and
a conductive interconnector contacting the impurity layer, wherein the device isolation trench is formed in the field region.

12. The structure of claim 11, wherein the conductive interconnector contacts the second conductive filler of the device isolation layer.

13. The structure of claim 11, wherein the gate structure comprises:
a buried structure on an inner sidewall and a bottom surface of a gate trench of the active region of the substrate, the buried structure including a buried gate insulation layer;
a buried gate conductive layer on the buried gate insulation layer, the buried gate conductive layer filling a lower portion of the gate trench; and
a capping layer on the buried gate conductive layer, the capping layer filling an upper portion of the gate trench.

14. The structure of claim 13, wherein:
the sidewall oxide layer and the separation layer include silicon oxide;
the first insulation layer and the second insulation layer include silicon nitride; and
the first and the second conductive fillers include a same material as the buried gate conductive layer.

* * * * *